United States Patent
Kawai et al.

(10) Patent No.: US 8,674,702 B2
(45) Date of Patent: Mar. 18, 2014

(54) APPARATUS FOR DETECTING A STATE OF SECONDARY BATTERY

(75) Inventors: Hirokazu Kawai, Toyota (JP); Yuichi Ibi, Toyohashi (JP); Kunio Kanamaru, Okazaki (JP)

(73) Assignees: Toyota Jidosha Kabushiki Kaisha, Toyota (JP); Panasonic EV Energy Co., Ltd., Kosai-shi (JP)

(*) Notice: Subject to any disclaimer, the term of this patent is extended or adjusted under 35 U.S.C. 154(b) by 568 days.

(21) Appl. No.: 12/675,068

(22) PCT Filed: Sep. 16, 2008

(86) PCT No.: PCT/JP2008/066633
§ 371 (c)(1),
(2), (4) Date: Feb. 24, 2010

(87) PCT Pub. No.: WO2009/038035
PCT Pub. Date: Mar. 26, 2009

(65) Prior Publication Data
US 2010/0308834 A1    Dec. 9, 2010

(30) Foreign Application Priority Data
Sep. 18, 2007 (JP) .................. 2007-240804

(51) Int. Cl.
*G01N 27/416* (2006.01)
*H02J 7/00* (2006.01)

(52) U.S. Cl.
USPC ........... 324/426; 324/427; 324/433; 320/132; 320/162

(58) Field of Classification Search
USPC ............................ 324/433
See application file for complete search history.

(56) References Cited

U.S. PATENT DOCUMENTS

| 6,060,186 A * | 5/2000 | Broussely ............... 429/7 |
| 6,192,272 B1 | 2/2001 | Fiedler |
| 2007/0065714 A1* | 3/2007 | Hambitzer et al. ....... 429/66 |
| 2007/0080668 A1* | 4/2007 | Al-Anbuky et al. ...... 320/136 |

FOREIGN PATENT DOCUMENTS

| JP | A-61-264687 | 11/1986 |
| JP | A-06-119942 | 4/1994 |
| JP | A-09-283182 | 10/1997 |
| JP | A-11-160371 | 6/1999 |
| JP | A-2005-091062 | 4/2005 |
| WO | WO 2009/036444 A2 | 3/2009 |

OTHER PUBLICATIONS

International Search Report issued in International Application No. PCT/JP2008/066633 on Nov. 11, 2008 (with English-language translation).

(Continued)

*Primary Examiner* — Edward Tso
*Assistant Examiner* — Johali Torres Ruiz
(74) *Attorney, Agent, or Firm* — Oliff PLC

(57) ABSTRACT

A lithium-ion secondary battery includes an aluminum case, an electrolytic solution, a positive plate, a negative plate, a positive terminal, a negative terminal, and voltage sensors. The positive terminal and the negative terminal project to the outside of the case while being insulated from the case. The voltage sensor is connected between the case and the positive terminal and detects the potential of the positive terminal with respect to a potential VR of the case. The voltage sensor is connected between the case and the negative terminal and detects the potential of the negative terminal with respect to the potential VR of the case. From the detected results, the states of the positive plate and the negative plate are separately detected.

6 Claims, 8 Drawing Sheets

(56) References Cited

OTHER PUBLICATIONS

Office Action mailed Nov. 4, 2008 in foreign Application No. 2007-240804 (with translation).
Written Opinion mailed Nov. 11, 2008 in International Application No. PCT/JP2008/066633 (with translation).
International Preliminary Report on Patentability mailed Apr. 6, 2009 in International Application No. PCT/JP2008/066633 (with translation).
Decision to Grant Patent mailed Sep. 15, 2009 in Japanese Application No. 2007-240804 (with translation).

* cited by examiner

APPARATUS FOR DETECTING A STATE OF SECONDARY BATTERY

TECHNICAL FIELD

The present invention relates generally to techniques employed to detect a state of a secondary battery and in particular to techniques employed to detect the states respectively of the positive and negative electrodes internal to the secondary battery.

BACKGROUND ART

A secondary battery supplying driving electric power to a motor of an electric vehicle or the like that is provided for traveling is configured of a plurality of battery modules connected in series, each formed of a plurality of battery cells connected in series. For such a secondary battery, each battery cell's voltage is detected using a technique, for example as disclosed in Japanese Patent Laying-open No. 2005-91062 (Patent Document 1).

Japanese Patent Laying-open No. 2005-91062 discloses an apparatus that detects the voltage of an assembled battery pack, comprising: an assembled battery pack formed of a plurality of unit batteries connected in series; differential amplification units provided for each of the unit batteries to detect the voltage of the unit battery; switch circuits for voltage detection, connecting/disconnecting the unit batteries and the differential amplification units; capacitance adjustment circuits provided for each of the unit batteries and formed of a resistor for discharging and a switch circuit for discharging, connected in series; an A/D conversion unit, and a microcomputer.

As disclosed in Japanese Patent Laying-open No. 2005-91062, when the apparatus that detects the voltage of an assembled battery pack detects each unit battery's voltage, the switch circuits for voltage detection are respectively turned on and all capacitance adjustment circuits are turned off. Thus each differential amplification unit is supplied between each differential input terminal with each unit battery's voltage, and outputs an output voltage corresponding to each voltage. The microcomputer successively takes in the voltage output from each differential amplification unit via the A/D conversion unit to detect each unit battery's voltage.
Patent Document 1: Japanese Patent Laying-open No. 2005-91062

DISCLOSURE OF THE INVENTION

Problems to be Solved by the Invention

The apparatus that detects the voltage of an assembled battery pack as disclosed in Patent Document 1 can detect a difference in voltage between the positive and negative electrodes of each unit battery. However, the apparatus cannot distinguishably detect the positive electrode's potential and the negative electrode's potential. Hence, the apparatus cannot distinguishably detect the positive electrode's state and the negative electrode's state.

The present invention has been made to overcome the above disadvantage, and it contemplates an apparatus for detecting a state of a secondary battery that can distinguishably detect a positive electrode's state and a negative electrode's state while avoiding an increased cost.

Means for Solving the Problems

The present apparatus for detecting a state of a secondary battery detects a state of a secondary battery having a positive electrode and a negative electrode. The present apparatus includes: a first detection unit using a potential of a casing of the secondary battery insulated from the positive electrode and the negative electrode as a reference potential to detect a potential difference between the reference potential and a potential of the positive electrode; and a second detection unit using the potential of the casing as a reference potential to detect a potential difference between the reference potential and a potential of the negative electrode.

In accordance with the present invention a potential difference between a reference potential and a potential of a positive electrode and a potential difference between the reference potential and a potential of a negative electrode are separately detected. When an electrode has its crystal structure varied, an electrolytic component is deposited, or the like, the electrode has a variation in potential, and which one of the positive electrode and the negative electrode has such a variation can be distinguishably detected. Note that the reference potential is a potential that the casing of the secondary battery insulated from the positive electrode and the negative electrode has. In other words, it is not necessary to additionally introduce a reference electrode for ensuring the reference potential. Thus the positive electrode's state and the negative electrode's state can distinguishably be detected while avoiding an increased cost. An apparatus can thus be provided for detecting a state of a secondary battery that can distinguishably detect a positive electrode's state and a negative electrode's state while avoiding an increased cost.

Preferably the casing is formed of metal. In accordance with the present invention, the casing is formed of a material of metal (e.g., aluminum) having a potential unique thereto, which can be used as the reference potential. The reference electrode thus has a stable value that is not affected by the secondary battery's state or other disturbance. As such, if each electrode's potential slightly varies, it can be detected with precision.

Still preferably, the potential of the casing is a potential between the potential of the positive electrode and the potential of the negative electrode.

In accordance with the present invention, the potential of the casing (i.e., the reference potential) is a potential between the potential of the positive electrode and the potential of the negative electrode. When the secondary battery has a decreasing state of charge, the positive electrode has a potential displaced to approach that of the negative electrode, and the negative electrode has a potential displaced to approach that of the positive electrode. Accordingly, when the positive electrode's potential and the reference potential has a reversed relationship in magnitude therebetween or the negative electrode's potential and the reference potential has a reversed relationship in magnitude therebetween, a decision can be made that the secondary battery has a decreased state of charge. The reference potential can thus be used to detect the positive electrode's state and the negative electrode's state and in addition that the secondary battery has a decreased state of charge.

Still preferably, the apparatus for detecting the state of the secondary battery further includes an abnormality detection unit for detecting that one electrode is abnormal from a potential difference of one electrode as detected by one of the first detection unit and the second detection unit.

In accordance with the present invention, one of a first detection unit and a second detection unit detects one electrode's potential difference, and therefrom, that one electrode is abnormal is detected. That the positive electrode is abnormal and that the negative electrode is abnormal can distinguishably be detected.

Still preferably, the abnormality detection unit detects that one electrode is abnormal from a variation of the potential difference of one electrode per unit time.

Each electrode may rapidly vary in potential when it is abnormal. For example, when one electrode is short circuited to another component (e.g., the other electrode, the secondary battery's casing, or the like), one electrode's potential rapidly approaches the short circuited, other component's potential. In accordance with the present invention, that one electrode is abnormal is detected from a variation of a potential difference of one electrode per unit time. That one electrode is abnormal can thus be detected for example when one electrode has a potential difference rapidly varying as it does when a short circuit is caused.

Still preferably, the apparatus for detecting the state of the secondary battery further includes a storage unit having previously stored therein a potential difference between the reference potential and a potential of one electrode that is provided when one electrode is normal. The abnormality detection unit compares the potential difference detected by one of the first detection unit and the second detection unit with the potential difference stored in the storage unit to detect that one electrode is abnormal. Each electrode gradually varies in potential as it has a crystal structure varied, an electrolytic component deposits, or the like. In accordance with the present invention, a potential difference between a reference potential and a potential of one electrode that is provided when it is normal is previously stored and the stored potential difference and a detected potential difference are compared to detect that one electrode is abnormal. Thus if an electrode has a crystal structure varied, an electrolytic component deposits, or a similar abnormality occurs, and the electrode accordingly, slightly varies in potential, such variation can be detected with precision.

DESCRIPTION OF THE REFERENCE SIGNS

Figure 1:
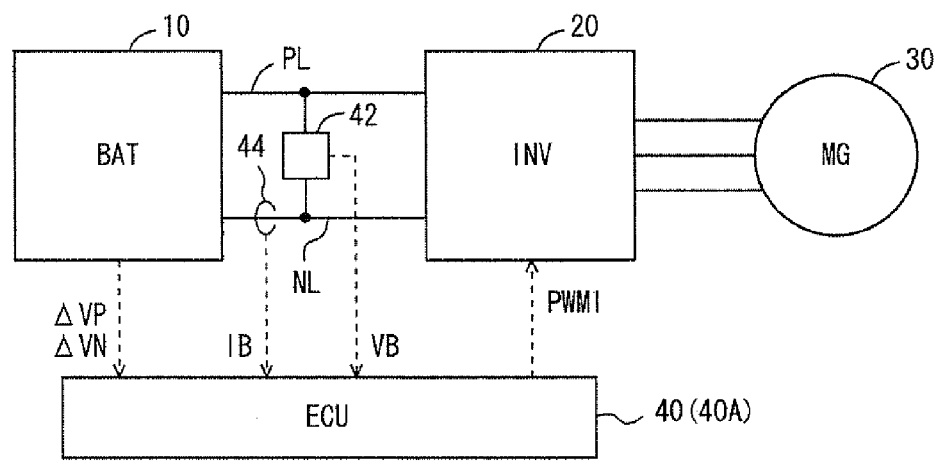
FIG. 1 is a block diagram generally showing an electric motor driving apparatus with an apparatus applied thereto for detecting a state of a secondary battery according to a first embodiment of the present invention.

10: lithium ion secondary battery, 20: inverter, 30: motor generator, 42: voltage sensor, 44: current sensor, 45: SOC calculation unit, 46: normal potential difference calculation unit, 47: positive electrode state determination unit, 48: negative electrode state determination unit, 50: casing, 52: electrolyte, 60: positive electrode plate, 62: negative electrode plate, 70: positive electrode terminal, 72: negative electrode terminal, 74: insulation sheet, 80, 82: voltage sensor, 100: electric motor driving apparatus.

BEST MODES FOR CARRYING OUT THE INVENTION

Hereinafter reference will be made to the drawings to describe the present invention in embodiments. In the following description, identical components are denoted by identical reference characters. Their names and functions are also identical. Accordingly, they will not be described repeatedly in detail.

First Embodiment

Reference will now be made to FIG. 1 to describe a vehicular electric motor driving apparatus 100 with an apparatus applied thereto for detecting a state of a secondary battery according to an embodiment of the present invention.

Electric motor driving apparatus 100 includes a lithium ion secondary battery 10, an inverter 20, a motor generator 30, an electronic control unit (ECU) 40, a voltage sensor 42, and a current sensor 44. Note that the present apparatus for detecting a state of a secondary battery is not limited in application to a lithium ion secondary battery. It may be applied for example to a nickel-meal hydride secondary battery.

Lithium ion secondary battery 10 outputs direct current electric power via a positive electrode line PL and a negative electrode line NL to inverter 20. Furthermore, lithium ion secondary battery 10 is chargeable. When motor generator 30 regenerates electric power, lithium ion secondary battery 10 receives the regenerated electric power via positive electrode line PL and negative electrode line NL from inverter 20 and is thus charged therewith. Lithium ion secondary battery 10 is structured, as will be described later.

Voltage sensor 42 detects voltage VB between positive electrode line PL and negative electrode line NL (i.e., the voltage of lithium ion secondary battery 10) and outputs the detected value to ECU 40.

Current sensor 44 detects a current IB flowing on negative electrode line NL and outputs the detected value to ECU 40. Note that it may detect current IB by detecting a current flowing on positive electrode line PL.

Inverter 20 is a 3 phase bridge circuit. Inverter 20 operates in response to a signal PWMI received from ECU 40 to convert direct current electric power between positive electrode line PL and negative electrode line NL to 3-phase alternate current electric power and outputs it to motor generator 30 to drive motor generator 30. Furthermore, when motor generator 30 regenerates electric power, inverter 20 receives the regenerated power from motor generator 30 and converts it to direct current electric power in response to signal PWMI, and outputs the direct current electric power on positive electrode line PL and negative electrode line NL to charge lithium ion secondary battery 10.

Motor generator 30 is a 3 phase alternate current electric motor and configured for example of a permanent magnet, synchronous motor including a rotor having a permanent magnet embedded therein. Motor generator 30 receives 3 phase alternate current electric power from inverter 20 to generate a driving torque. Furthermore, motor generator 30 in regenerative braking externally receives rotational energy to generate electric power and outputs the regenerated electric power to inverter 20.

Based on a target torque value for motor generator 30, a target revolution speed value for the motor generator, the motor's current and rotation angle, voltage VB detected by voltage sensor 42, and current IB detected by current sensor 44, ECU 40 generates a pulse width modulation (PWM) signal for driving motor generator 30, and outputs the generated PWM signal as signal PWMI to inverter 20. Note that the motor's current and rotation angle are detected by a sensor (not shown).

Figure 2:
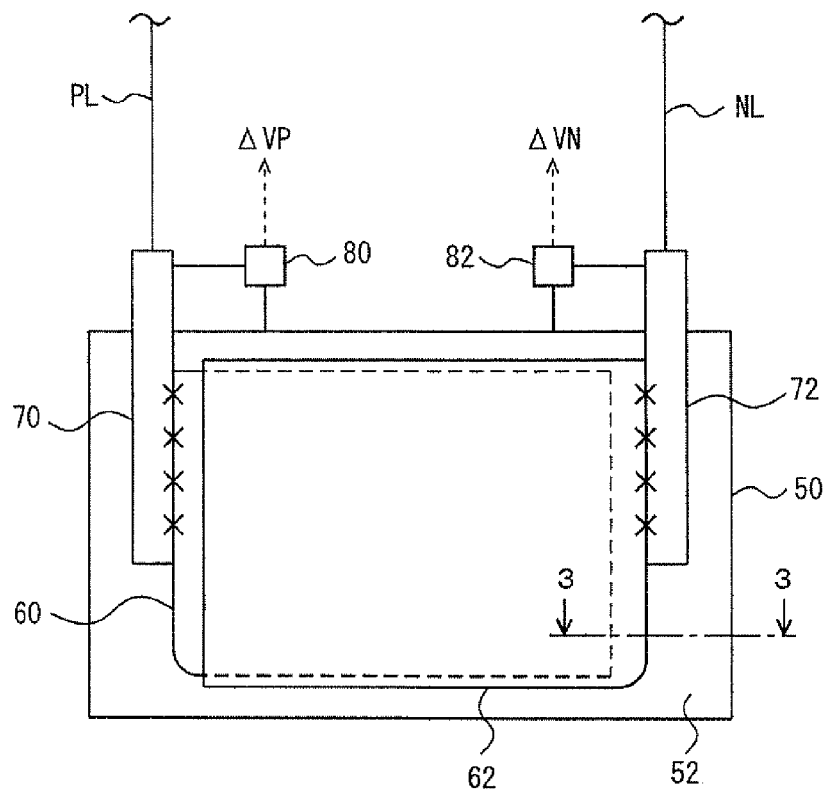
FIG. 2 schematically shows a configuration of a lithium ion secondary battery according to the first embodiment of the present invention.
Figure 3:
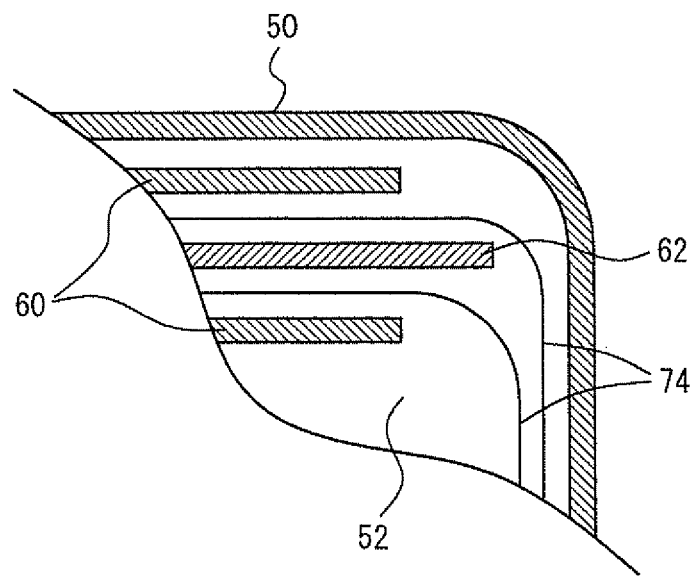
FIG. 3 is a partially enlarged view of FIG. 2 as taken along a cross section 3-3.

With reference to FIG. 2 and FIG. 3, lithium ion secondary battery 10 will be described. FIG. 2 schematically shows a configuration of lithium ion secondary battery 10 shown in FIG. 1. FIG. 3 is a partially enlarged view of FIG. 2 as taken along a cross section 3-3.

Lithium ion secondary battery 10 includes a casing 50, an electrolyte 52, a positive electrode plate 60, a negative electrode plate 62, a positive electrode terminal 70, a negative electrode terminal 72, and voltage sensors 80, 82.

Casing 50 is a container formed of aluminum and is sealed with electrolyte 52 accommodated therein. Casing 50 is mounted on a vehicle without being grounded (i.e., such that it is electrically floating). Note that casing 50 is not limited in material to aluminum: it may be formed of a metal that has a unique potential.

Positive electrode plate 60 and negative electrode plate 62 are accommodated internal to casing 50 together with electrolyte 52. Positive electrode plate 60 and negative electrode plate 62 are wound several times with an insulation sheet 74 posed therebetween (see FIG. 3), and in that condition, positive electrode plate 60 and negative electrode plate 62 are accommodated such that they are not in contact with (i.e., are insulated from) casing 50.

Positive electrode plate 60 is formed of a lithium containing oxide capable of reversibly insertion/extraction lithium ions. It is formed for example of lithium nickel oxide, lithium cobalt oxide, lithium manganese oxide or the like. Positive electrode plate 60 in a charging process discharges lithium ions and in a discharging process occludes lithium ions discharged from negative electrode plate 62. Positive electrode plate 60 partially projects from negative electrode plate 62 and that projection is welded to positive electrode terminal 70.

Negative electrode plate 62 is formed of a material of carbon capable of reversibly insertion/extraction lithium ions. It is formed for example of graphite. Negative electrode plate 62 in the charging process occludes lithium ions discharged from positive electrode plate 60 and in the discharging process discharges lithium ions. Negative electrode plate 62 partially projects from positive electrode plate 60 and that projection is welded to negative electrode terminal 72.

Positive electrode terminal 70 and negative electrode terminal 72 are insulated from casing 50 and in that condition project outside casing 50, and positive electrode terminal 70 is connected to positive electrode line PL and negative electrode terminal 72 is connected to negative electrode line NL.

Voltage sensor 80 is connected between casing 50 and positive electrode terminal 70. Voltage sensor 82 is connected between casing 50 and negative electrode terminal 72. Voltage sensors 80, 82 will be described later.

Figure 4:
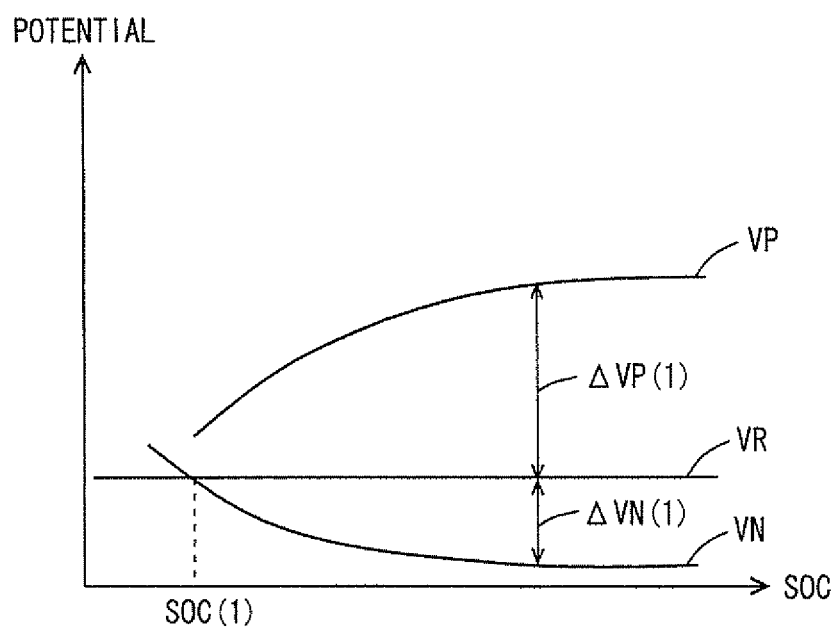
FIG. 4 represents a positive electrode terminal, a negative electrode terminal, and a casing in potential when the lithium ion secondary battery according to the first embodiment of the present invention is normal.

Reference will be made to FIG. 4 to describe a relationship between the potentials of positive electrode terminal 70, negative electrode terminal 72 and casing 50 and the state of charge (SOC) of lithium ion secondary battery 10. FIG. 4 represents a potential VP of positive electrode terminal 70, a potential VN of negative electrode terminal 72, and a potential VR of casing 50, with the SOC serving as a parameter, when positive electrode terminal 70 and negative electrode terminal 72 are in a normal state.

Potential VP of positive electrode terminal 70 is relatively higher than potential VN of negative electrode terminal 72. Potential VP of positive electrode terminal 70 decreases as the SOC decreases. Potential VN of negative electrode terminal 72 increases as the SOC decreases, and when the SOC decreases to be equal to or smaller than a predetermined value SOC(1), potential VN of negative electrode terminal 72 attains a value higher than potential VR of casing 50.

Potential VR of casing 50 normally (or when the SOC is equal to or larger than predetermined value SOC(1)) has a value between potential VP of positive electrode terminal 70 and potential VN of negative electrode terminal 72. Potential VR of casing 50 assumes a unique value determined by what type of metal is used to form casing 50 (in the present embodiment, aluminum). In other words, potential VR of casing 50 is a unique potential that casing 50 has, and has a stable value that is not affected by the SOC, disturbance or the like.

In the present embodiment when lithium ion secondary battery 10 is repeatedly charged and discharged and, accordingly, internally has anomalies caused therein (such as positive electrode plate 60 having its crystal collapsed, negative electrode plate 62 having metal lithium deposited thereon, each electrode plate and each electrode terminal poorly welded, and the like), lithium ion secondary battery 10 varies in voltage VB or has an extremely increased internal temperature or the like and is thus impaired in performance as a battery. At the time, simply detecting voltage VB of lithium ion secondary battery 10 (i.e., a difference between potential VP of positive electrode terminal 70 and potential VN of negative electrode terminal 72) cannot detect which electrode plate or electrode terminal is abnormal.

Accordingly the present embodiment has adopted a value between potential VP of positive electrode terminal 70 and potential VN of negative electrode terminal 72, i.e., potential VR that casing 50 has (hereinafter also referred to as intermediate potential VR), as a reference potential for detecting each electrode's potential. More specifically, a potential of positive electrode terminal 70 relative to intermediate potential VR is detected as a positive electrode potential difference ΔVP by voltage sensor 80 and a potential of negative electrode terminal 72 relative to intermediate potential VR is detected as a negative electrode potential difference ΔVN by voltage sensor 82, and the state of positive electrode plate 60 and that of negative electrode plate 62 are distinguishably detected in accordance with positive electrode potential difference ΔVP and negative electrode potential difference ΔVN as detected.

Note that in the following description, voltage sensor 80 detects positive electrode potential difference ΔVP as a positive value when potential VP of positive electrode terminal 70 is higher than intermediate potential VR, and voltage sensor 82 detects negative electrode potential difference ΔVN as a positive value when potential VN of negative electrode terminal 72 is higher than intermediate potential VR, for the sake of illustration.

Figure 5:
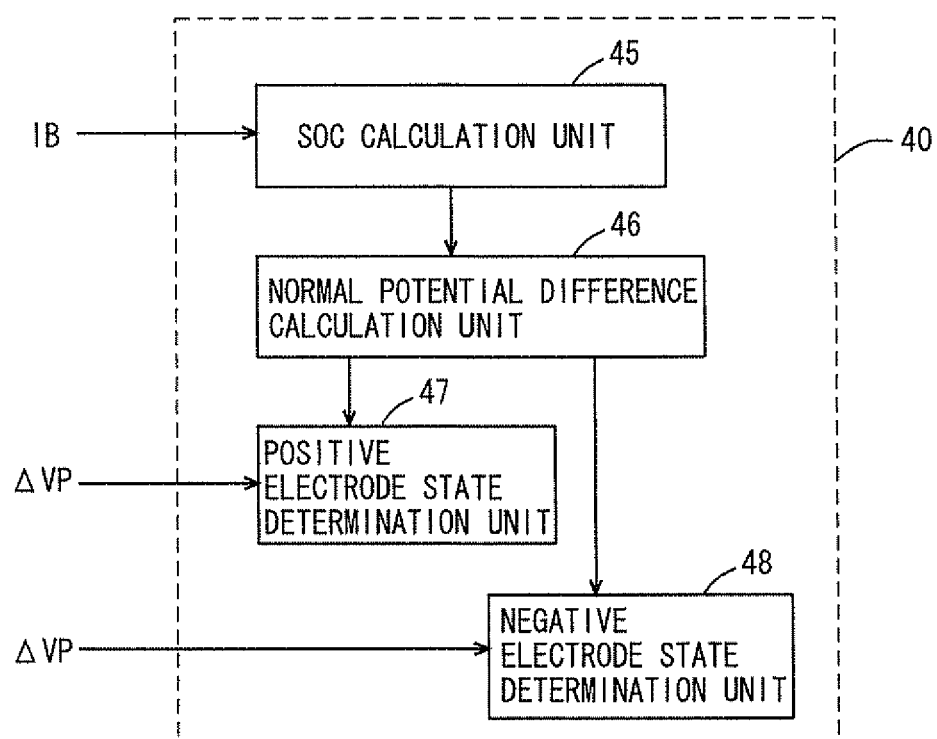
FIG. 5 is a block diagram in function of the apparatus for detecting a state of a secondary battery according to the first embodiment of the present invention.

FIG. 5 is a block diagram representing in function the apparatus for detecting a state of a secondary battery according to the present embodiment. As shown in FIG. 5, the present apparatus for detecting a state of a secondary battery includes an SOC calculation unit 45, a normal potential difference calculation unit 46, a positive electrode state determination unit 47, and a negative electrode state determination unit 48.

SOC calculation unit 45 calculates an SOC of lithium ion secondary battery 10 from current IB detected by current sensor 44.

Normal potential difference calculation unit 46 receives the calculated SOC and calculates therefrom a normal positive electrode potential difference ΔVP(1) and a normal negative electrode potential difference ΔVN(1) provided when lithium ion secondary battery 10 is in a normal state.

Positive electrode state determination unit 47 compares positive electrode potential difference ΔVP detected by voltage sensor 80 with normal positive electrode potential difference ΔVP(1) calculated by normal potential difference calculation unit 46 to determine whether the positive electrode (positive electrode plate 60 and positive electrode terminal 70) is in an abnormal state.

Negative electrode state determination unit 48 compares negative electrode potential difference ΔVN detected by voltage sensor 82 with normal negative electrode potential difference ΔVN(1) calculated by normal potential difference calculation unit 46 to determine whether the negative electrode (negative electrode plate 62 and negative electrode terminal 72) is in an abnormal state.

A control device having such a function block according to the present embodiment can be implemented by hardware mainly of a configuration of a digital circuit, an analog circuit and the like, or software mainly of a central processing unit (CPU) and a memory included in an ECU and a program read from the memory and executed by the CPU. In general, it is said that the control device implemented by hardware is advantageous in speed of operation and that the control device implemented by software is advantageous in changing a design. Hereinafter will be described a control device implemented as software. Note that a storage medium having such a program stored therein is also a manner of the present invention.

Figure 6:
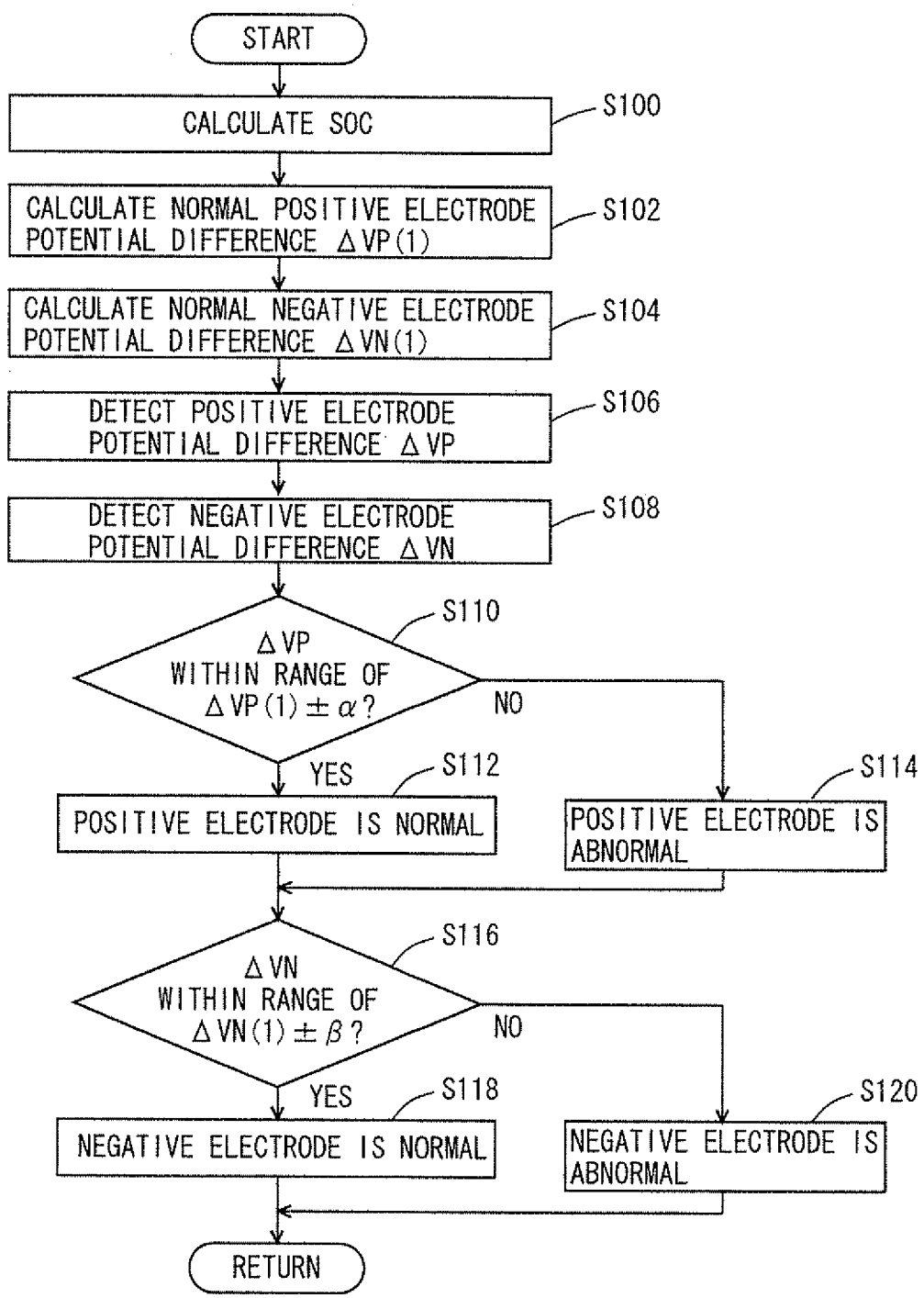
FIG. 6 is a flowchart for illustrating a structure of an ECU for control, that configures the apparatus for detecting a state of a secondary battery according to the first embodiment of the present invention.

With reference to FIG. 6, the apparatus for detecting a state of a secondary battery according to the present embodiment, or ECU 40, executes a program having a structure for control, as will be described hereinafter. Note that this program is executed repeatedly in a predetermined cycle time.

In Step (S) 100, ECU 40 calculates an SOC of lithium ion secondary battery 10 from current IB detected by current sensor 44.

In S102, ECU 40 calculates normal positive electrode potential difference ΔVP(1) from the calculated SOC. For example, ECU 40 has previously stored a map representing a relationship of VP obtained for lithium ion secondary battery 10 in the normal state and VR, and the battery's SOC, as shown in FIG. 4 described above, and uses this map and a calculated SOC to calculate normal positive electrode potential difference ΔVP(1).

In S104, ECU 40 calculates normal negative electrode potential difference ΔVN(1) from the calculated SOC. For example, ECU 40 has previously stored a map representing a relationship of VN obtained for lithium ion secondary battery 10 in the normal state and VR, and the battery's SOC, as shown in FIG. 4 described above, and uses this map and a calculated SOC to calculate normal negative electrode potential difference ΔVN(1).

In S106, ECU 40 receives a signal from voltage sensor 80 and detects positive electrode potential difference ΔVP based thereon. In S108, ECU 40 receives a signal from voltage sensor 82 and detects negative electrode potential difference ΔVN based thereon.

In S110, ECU 40 determines if positive electrode potential difference ΔVP falls within a range of normal positive electrode potential difference ΔVP(1)±α. α is predetermined as based on a difference of a potential of the positive electrode in the normal state and that of the positive electrode in an abnormal state that is intolerable. If ΔVP falls within the range of ΔVP(1)±α (YES in S110), the process proceeds to S112. Otherwise (NO in S110), the process proceeds to S114.

In S112, ECU 40 determines that the positive electrode is normal. In S114, ECU 40 determines that the positive electrode is abnormal.

In S116, ECU 40 determines if negative electrode potential difference ΔVN falls within a range of normal negative electrode potential difference ΔVN(1)±β. β is predetermined as based on a difference of a potential of the negative electrode in the normal state and that of the negative electrode in an abnormal state that is intolerable. If ΔVN falls within the range of ΔVN(1)±β (YES in S116), the process proceeds to S118. Otherwise (NO in S116), the process proceeds to S120.

In S118, ECU 40 determines that the negative electrode is normal. In S120, ECU 40 determines that the negative electrode is abnormal.

In accordance with the above described structure and flowchart, the apparatus for detecting a state of a secondary battery according to the present embodiment, or ECU 40, operates, as will be described hereinafter.

From current IB detected by current sensor 44, an SOC of lithium ion secondary battery 10 is calculated (S100), and the calculated SOC is used to calculate normal positive electrode potential difference ΔVP(1) (S102).

Figure 7:
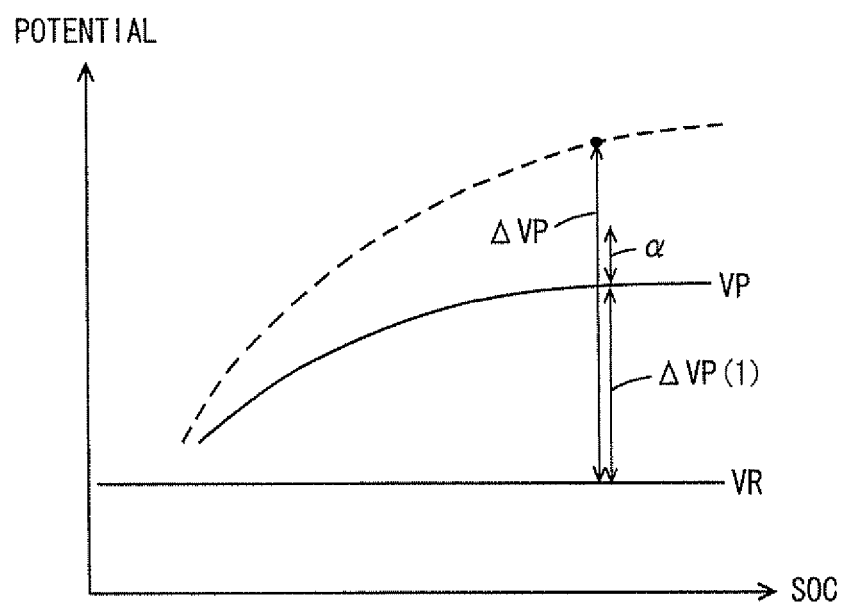
FIG. 7 represents one example of a potential in the lithium ion secondary battery according to the first embodiment of the present invention when the positive electrode terminal is abnormal.

Based on a signal received from voltage sensor 80, positive electrode potential difference ΔVP is detected (S106), and, as shown in FIG. 7, if for example positive electrode plate 60 and positive electrode terminal 70 are poorly welded together and positive electrode potential difference ΔVP is accordingly larger than normal positive electrode potential difference ΔVP(1)±α (NO in S110), a decision is made that the positive electrode is abnormal (S114).

Figure 8:
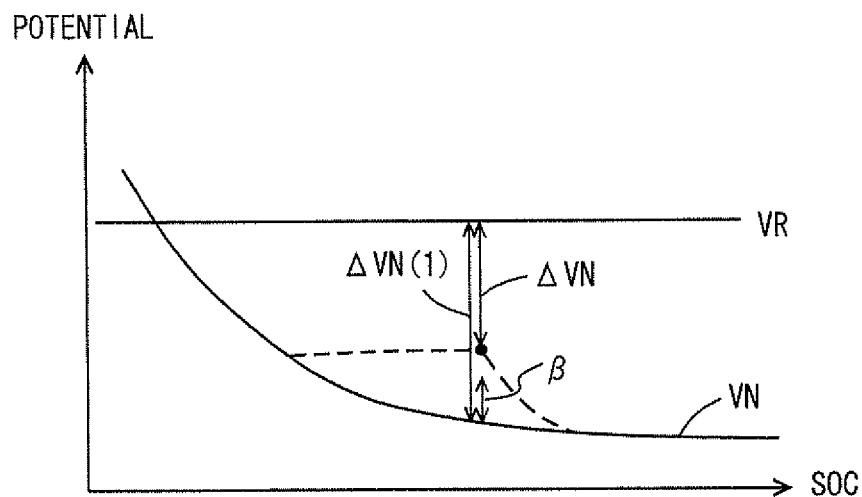
FIG. 8 is a first diagram showing one example of a potential in the lithium ion secondary battery according to the first embodiment of the present invention when the negative electrode terminal is abnormal.
Figure 9:
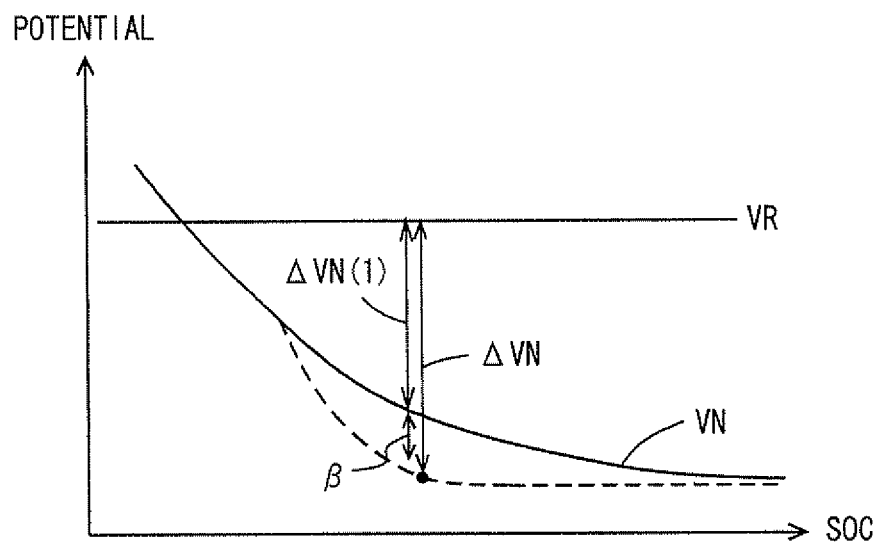
FIG. 9 is a second diagram showing one example of a potential in the lithium ion secondary battery according to the first embodiment of the present invention when the negative electrode terminal is abnormal.

On the other hand, based on a signal received from voltage sensor 82, negative electrode potential difference ΔVN is detected (S108), and if negative electrode plate 62 has metal lithium deposited thereon or has another abnormality, and accordingly, as shown in FIG. 8 and FIG. 9, negative electrode potential difference ΔVN does not fall within the range of normal negative electrode potential difference ΔVN(1)±β, (NO in S116), a decision is made that the negative electrode is abnormal (S120).

Thus, positive electrode potential difference ΔVP and negative electrode potential difference ΔVN are separately detected, and therefrom the positive electrode's state and the negative electrode's state are distinguishably determined. In comparison with using voltage difference VB between the positive electrode and the negative electrode to determine a state of lithium ion secondary battery 10, that lithium ion secondary battery 10 is abnormal can be detected more precisely, and which electrode is abnormal can also be detected.

Furthermore, positive electrode potential difference ΔVP and negative electrode potential difference ΔVN are detected with the potential of casing 50 serving as a reference potential. This can eliminate the necessity of additionally introducing a reference electrode for ensuring the reference potential. This can contribute to avoiding an increased cost and also allows the positive electrode's state and the negative electrode's state to be detected separately.

Furthermore, the reference potential has a value unique to casing 50 and is a stable value that is not affected by the SOC, disturbance or the like. As such, if each electrode's potential slightly varies, it can be detected with precision.

The present embodiment thus provides an apparatus for detecting a state of a secondary battery, that employs the potential of a casing of the secondary battery as a reference potential to detect the positive electrode's potential and the negative electrode's potential which are in turn used to determine the positive electrode's state and the negative electrode's state, respectively, separately. This can eliminate the necessity of additionally introducing a reference electrode for ensuring the reference potential, and furthermore, as the casing has a potential having a stable value that is not affected by the SOC, disturbance or the like, the positive electrode's state and the negative electrode's state can be detected with precision.

Note that in the embodiment, in addition to or apart from detecting each electrode's state, that lithium ion secondary battery 10 has a reduced SOC may be detected based on negative electrode potential difference ΔVN. More specifically, as has been described above, potential VN of negative electrode terminal 72 increases as the SOC of lithium ion secondary battery 10 decreases, and once the SOC has decreased to be equal to or smaller than predetermined value SOC(1), potential VN of negative electrode terminal 72 varies from a value lower than intermediate potential VR to a value higher than intermediate potential VR, and potential VN of negative electrode terminal 72 and intermediate potential VR have therebetween a reversed relationship in magnitude. Accordingly, when negative electrode potential difference ΔVN varies from a negative value to a positive value, a decision can be made that the SOC has a small value equal to or smaller than predetermined value SOC(1).

Furthermore, when a reduced SOC causes a reversed relationship in magnitude between potential VP of positive electrode terminal 70 and intermediate potential VR, that lithium ion secondary battery 10 has a reduced SOC may be detected based on positive electrode potential difference ΔVP.

Second Embodiment

The present embodiment provides an apparatus for detecting a state of a secondary battery, as will be described hereinafter. The present embodiment provides an apparatus for detecting a state of a secondary battery, that is different in configuration from that of the first embodiment in that ECU 40 is replaced with an ECU 40A. ECU 40 and ECU 40A are different only in that the latter executes a program having a structure for control that is different from the structure of the program that the former executes for control. The remainder of the apparatus for detecting a state of a secondary battery according to the second embodiment is identical in configuration to that of the apparatus for detecting a state of a secondary battery according to the first embodiment. Identical components are denoted by identical reference characters. Their functions are also identical. Accordingly, they will not be described repeatedly in detail.

Figure 10:
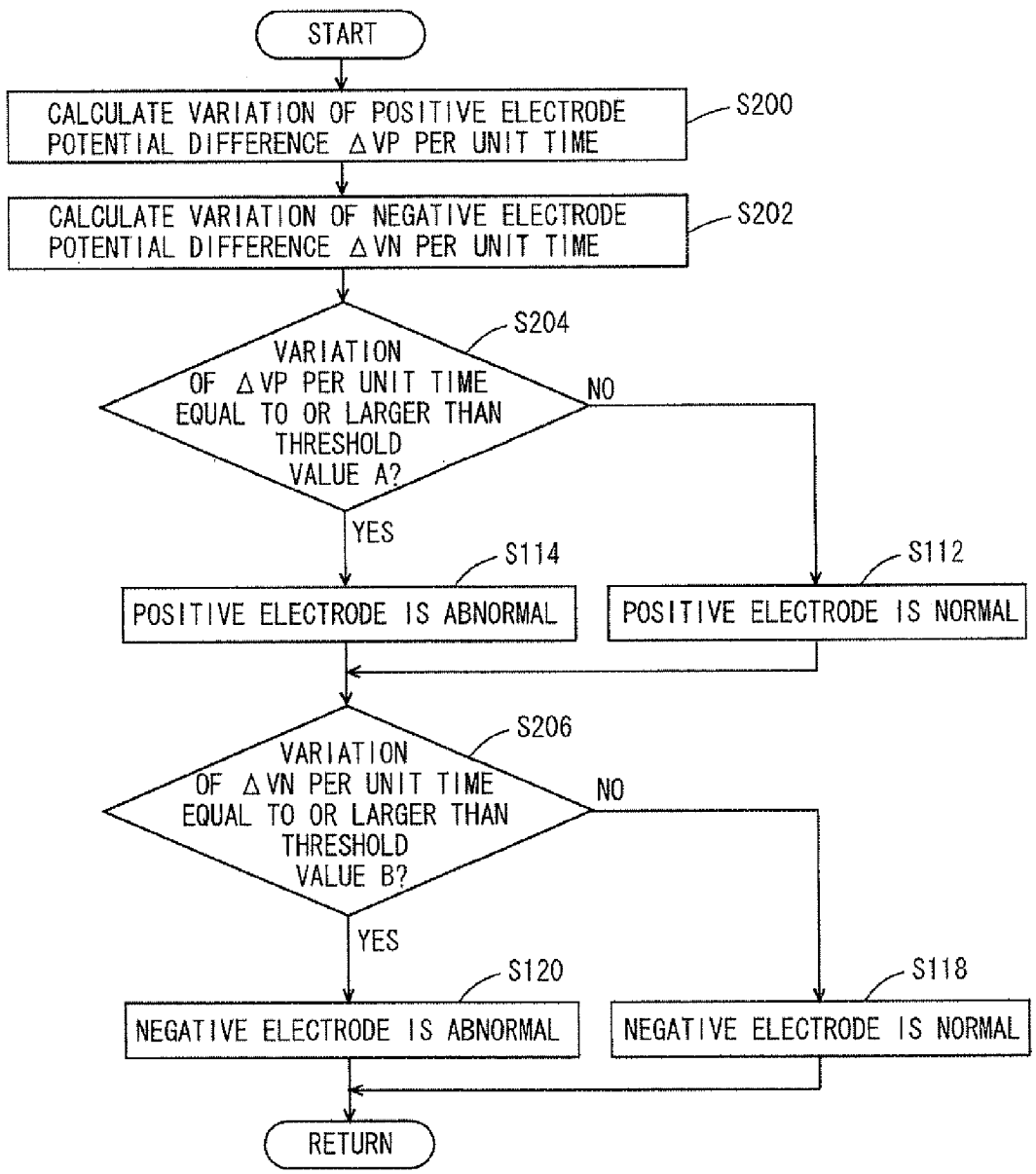
FIG. 10 is a flowchart for illustrating a structure of an ECU for control, that configures an apparatus for detecting a state of a secondary battery according to a second embodiment of the present invention.

With reference to FIG. 10, the apparatus for detecting a state of a secondary battery according to the present embodiment, or ECU 40A, executes a program having a structure for control, as will be described hereinafter. Note that the FIG. 10 flowchart includes some steps identical to those indicated in the FIG. 6 flowchart. Such steps are identically denoted. As they are identical steps, they will not be described repeatedly.

In S200, ECU 40A receives a signal from voltage sensor 80 and calculates in accordance therewith a variation of positive electrode potential difference ΔVP per unit time. In S202, ECU 40A receives a signal from voltage sensor 82 and calculates in accordance therewith a variation of negative electrode potential difference ΔVN per unit time.

In S204, ECU 40A determines if the variation of positive electrode potential difference ΔVP per unit time is equal to or larger than a threshold value A. Threshold value A is set at a value exceeding a variation of positive electrode potential difference ΔVP per unit time, that is provided when it is normal. If the variation is equal to or larger than threshold value A (YES in S204), the process proceeds to S114. Otherwise (NO in S204), the process proceeds to S112.

In S206, ECU 40A determines if the variation of negative electrode potential difference ΔVN per unit time is equal to or larger than a threshold value B. Threshold value B is set at a value exceeding a variation of negative electrode potential difference ΔVN per unit time, that is provided when it is normal. If the variation is equal to or larger than threshold value B (YES in S206), the process proceeds to S120. Otherwise (NO in S206), the process proceeds to S118.

In accordance with the above described structure and flowchart, the apparatus for detecting a state of a secondary battery according to the present embodiment, or ECU 40A, operates as will be described hereinafter.

Figure 11:
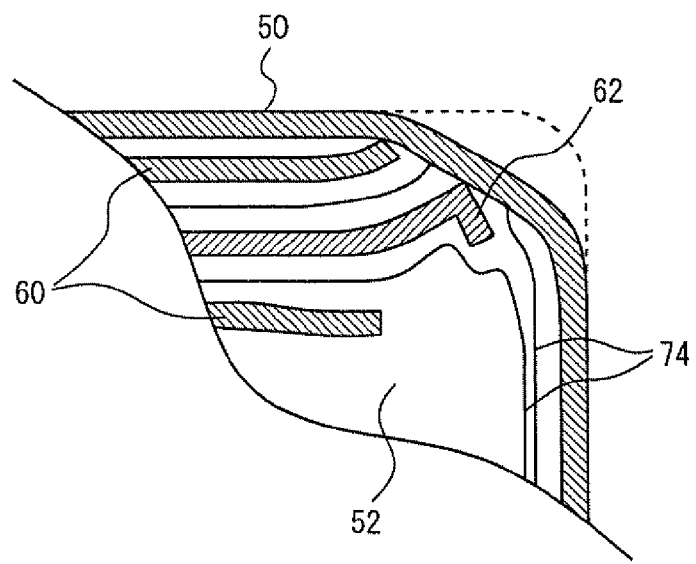
FIG. 11 is a partially enlarged view of a lithium ion secondary battery according to the second embodiment of the present invention when it is abnormal.

As shown in FIG. 11, as casing 50 is deformed by external force or the battery is repeatedly charged/discharged and electrolyte 52 accordingly expands, positive electrode plate 60 and negative electrode plate 62 contact an internal wall of casing 50, for the sake of illustration.

Figure 12:
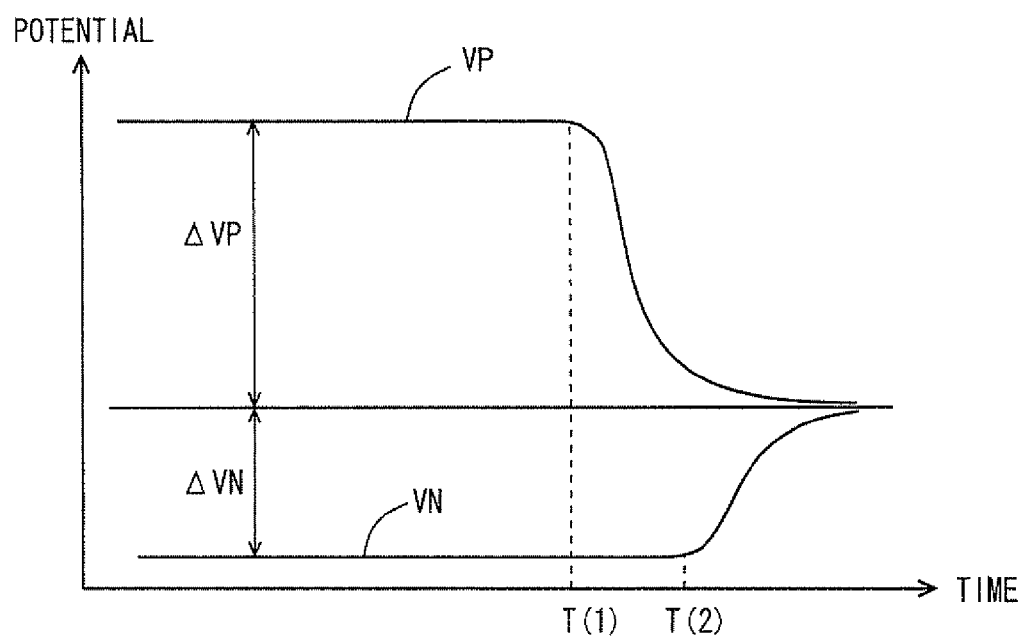
FIG. 12 represents one example of a potential in the lithium ion secondary battery according to the second embodiment of the present invention when the positive electrode terminal and the negative electrode terminal are abnormal.

In that case, positive electrode terminal 70 is contacted via positive electrode plate 60 by casing 50 and thus short circuited, and accordingly, positive electrode terminal 70 has potential VP, as shown in FIG. 12, rapidly decreasing to a value close to intermediate potential VR since positive electrode terminal 70 is contacted by casing 50, i.e., time T(1). Accordingly, positive electrode potential difference ΔVP also rapidly decreases. At the time, positive electrode potential difference ΔVP decreases per unit time in an amount equal to or larger than threshold value A (YES in S204), and a decision is made that the positive electrode is abnormal (S114).

Furthermore, negative electrode terminal 72 is contacted via negative electrode plate 62 by casing 50 and thus short circuited, and accordingly, negative electrode terminal 72 has potential VN, as shown in FIG. 12, rapidly increasing to a value close to intermediate potential VR since negative electrode terminal 72 is contacted by casing 50, i.e., time T(2). Accordingly, negative electrode potential difference ΔVN also rapidly decreases. At the time, negative electrode potential difference ΔVN decreases per unit time in an amount equal to or larger than threshold value B (YES in S206), and a decision is made that the negative electrode is abnormal (S120).

Thus, the potential of casing 50 is used as a reference potential to detect positive electrode potential difference ΔVP and negative electrode potential difference ΔVN, and in accordance therewith the positive electrode's state and the negative electrode's state are distinguishably determined. Thus, as well as in the first embodiment, that lithium ion secondary battery 10 is abnormal can be detected more precisely, and which electrode is abnormal can also be detected, while an increased cost can be avoided.

Furthermore, an electrode's state is determined from a variation of a corresponding, positive electrode potential difference ΔVP/negative electrode potential difference ΔVN per unit time. Accordingly, if positive electrode potential difference ΔVP/negative electrode potential difference ΔVN vary in such an amount per unit time that has such a small value that is caused when the battery is normally charged/discharged, a decision can be made that the electrode is normal, and if positive electrode potential difference ΔVP/negative electrode potential difference ΔVN vary in such an amount per unit time that has such a large value that is caused when a short circuit is caused, a decision can be made that the electrode is abnormal.

The present embodiment can thus provide an apparatus for detecting a state of a secondary battery, that, as well as in the first embodiment, can detect the positive electrode's state and the negative electrode's state with precision without the necessity of additionally introducing a reference electrode for ensuring a reference potential. Furthermore, whether each electrode is abnormal is detected from a variation of a potential difference of the electrode per unit time. That the electrode is abnormal can thus be detected when the electrode has a difference in potential that varies more rapidly than when the battery is normally charged/discharged.

It should be understood that the embodiments disclosed herein are illustrative and non-restrictive in any respect. The scope of the present invention is defined by the terms of the claims, rather than the description above, and is intended to include any modifications within the scope and meaning equivalent to the terms of the claims.

The invention claimed is:

1. An apparatus for detecting a state of a secondary battery having a positive electrode and a negative electrode, comprising:
    a first detection unit using a potential of a metallic casing of said secondary battery insulated from said positive electrode and said negative electrode as a reference potential to detect a potential difference between said reference potential and a potential of said positive electrode as a detected positive electrode potential difference;
    a second detection unit using said potential of said metallic casing as a reference potential to detect a potential difference between said reference potential and a potential of said negative electrode as a detected negative electrode potential difference;
    a first calculation unit calculating a state of charge of said secondary battery;
    a second calculation unit calculating a normal positive electrode potential difference and a normal negative electrode potential difference based on said state of charge of said secondary battery, said normal positive electrode potential difference indicating a potential difference between said reference potential and a potential of said positive electrode that is provided when said positive electrode is normal, said normal negative electrode potential difference indicating a potential difference between said reference potential and a potential of said negative electrode that is provided when said negative electrode is normal; and
    an abnormality detection unit for comparing said detected positive electrode potential difference with said normal positive electrode potential difference and determining that said positive electrode is abnormal when said detected positive electrode potential difference and said normal positive electrode potential difference have a difference exceeding a first predetermined range and for comparing said detected negative electrode potential difference with said normal negative electrode potential difference and determining that said negative electrode is abnormal when said detected negative electrode potential difference and said normal negative electrode potential difference have a difference exceeding a second predetermined range.

2. The apparatus for detecting the state of the secondary battery according to claim 1, wherein said potential of said metallic casing is a potential between said potential of said positive electrode and said potential of said negative electrode.

3. The apparatus for detecting the state of the secondary battery according to claim 2, wherein said abnormality detection unit detects that (1) said positive electrode is abnormal from a variation of said potential difference between said reference potential and said potential of said positive electrode per unit time, and (2) said negative electrode is abnormal from a variation of said potential difference between said reference potential and said potential of said negative electrode per unit time.

4. The apparatus for detecting the state of the secondary battery according to claim 2, further comprising
    a storage unit having previously stored therein a correspondence between said state of charge of said secondary battery, said normal positive electrode potential difference and said normal negative electrode potential difference, wherein
    said second calculation unit refers to said correspondence stored in said storage unit to calculate said normal positive electrode potential difference and said normal negative electrode potential difference corresponding to said state of charge of said secondary battery.

5. The apparatus for detecting the state of the secondary battery according to claim 1, wherein said abnormality detection unit detects that (1) said positive electrode is abnormal from a variation of said potential difference between said reference potential and said potential of said positive electrode per unit time, and (2) said negative electrode is abnormal from a variation of said potential difference between said reference potential and said potential of said negative electrode per unit time.

6. The apparatus for detecting the state of the secondary battery according to claim 1, further comprising
    a storage unit having previously stored therein a correspondence between said state of charge of said secondary battery, said normal positive electrode potential difference and said normal negative electrode potential difference, wherein
    said second calculation unit refers to said correspondence stored in said storage unit to calculate said normal positive electrode potential difference and said normal negative electrode potential difference corresponding to said state of charge of said secondary battery.

* * * * *